(12) United States Patent
Chen

(10) Patent No.: US 6,959,755 B2
(45) Date of Patent: Nov. 1, 2005

(54) TUBE-STYLE RADIATOR STRUCTURE FOR COMPUTER

(76) Inventor: Kuo Jui Chen, No. 73-1, Lane 46, Fengjiang Road, Taishan, Taipei County (TW)

( * ) Notice: Subject to any disclaimer, the term of this patent is extended or adjusted under 35 U.S.C. 154(b) by 306 days.

(21) Appl. No.: 10/058,498

(22) Filed: Jan. 30, 2002

(65) Prior Publication Data

US 2003/0141041 A1 Jul. 31, 2003

(51) Int. Cl.[7] .................................................. H05K 7/20
(52) U.S. Cl. ............................. 165/80.3; 165/104.33; 361/700
(58) Field of Search ..................... 165/80.3, 104.21, 165/104.14, 104.33, 185, 104.26, 182; 361/699, 700, 697, 708–710; 257/722, 714, 715

(56) References Cited

U.S. PATENT DOCUMENTS

| | | | | |
|---|---|---|---|---|
| 5,699,853 A | * | 12/1997 | Goth et al. ............. | 165/104.33 |
| 5,845,702 A | * | 12/1998 | Dinh .................... | 165/104.21 |
| 5,959,837 A | * | 9/1999 | Yu ....................... | 165/80.3 |
| 6,084,772 A | * | 7/2000 | Pell et al. .............. | 165/104.33 |
| 6,102,110 A | * | 8/2000 | Julien et al. ........... | 165/80.3 |
| 6,189,601 B1 | * | 2/2001 | Goodman et al. ........ | 165/80.3 |
| 6,382,307 B1 | * | 5/2002 | Wang et al. ............ | 165/80.3 |
| 6,394,175 B1 | * | 5/2002 | Chen et al. ............ | 165/80.3 |

FOREIGN PATENT DOCUMENTS

| | | | | |
|---|---|---|---|---|
| JP | 0207039 | * | 9/1986 | ............ 165/104.33 |
| JP | 7169889 | * | 7/1995 | ............ 165/104.33 |

* cited by examiner

Primary Examiner—Allen Flanigan

(57) ABSTRACT

This invention is a tube-style radiator structure, which includes an air-cooled fins, two heat conduction tubes, a base and a cover. Each of the heat conduction tubes has two straight tube sections and an arc tube section so as to form the shape of "U". One of the straight tube sections of each heat conduction tube passes through the air-cooling fin part and the other straight tube thereof lies in one of two grooves provided in the base. Accordingly, a large cooling area can be obtained and the efficiency of heat dissipation can be enhanced effectively.

2 Claims, 3 Drawing Sheets

TUBE-STYLE RADIATOR STRUCTURE FOR COMPUTER

BACKGROUND OF THE INVENTION

1. Field of the Invention

The present invention relates to a tube-style radiator structure for a computer, in particular, to a radiator structure, which provides a high capacity in heat conduction and dissipation.

2. Description of Related Art

Due to the running speed of an electronic component such as the central processing unit (CPU) in a computer increasing rapidly, the demand for higher efficiency of heat dissipation has increased. Currently, air cooling fins and a cooling fan are widely used as the heat dissipation device because direct effect can be achieved and the cost is low. However, it is known that the efficiency of heat dissipation depends on the structure of the cooling fins very much. Hence, how to maximize the contact surface between the cooling fins and the electronic component and how to provide a sufficient area for heat dissipation are problems to be addressed.

SUMMARY OF THE INVENTION

An object of the present invention is to provide a tube-style radiator structure in which two arc tubes for conducting heat are provided to pass through specifically designed cooling fins, and a base is disposed under the arc tubes with a flat bottom so that the efficiency of heat conduction and the efficiency of heat dissipation can be enhanced substantially.

Another object of the present invention is to provide a tube-style radiator structure, which can be easily fabricated and can be set up simply.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE PREFERRED EMBODIMENT

Figure 1:
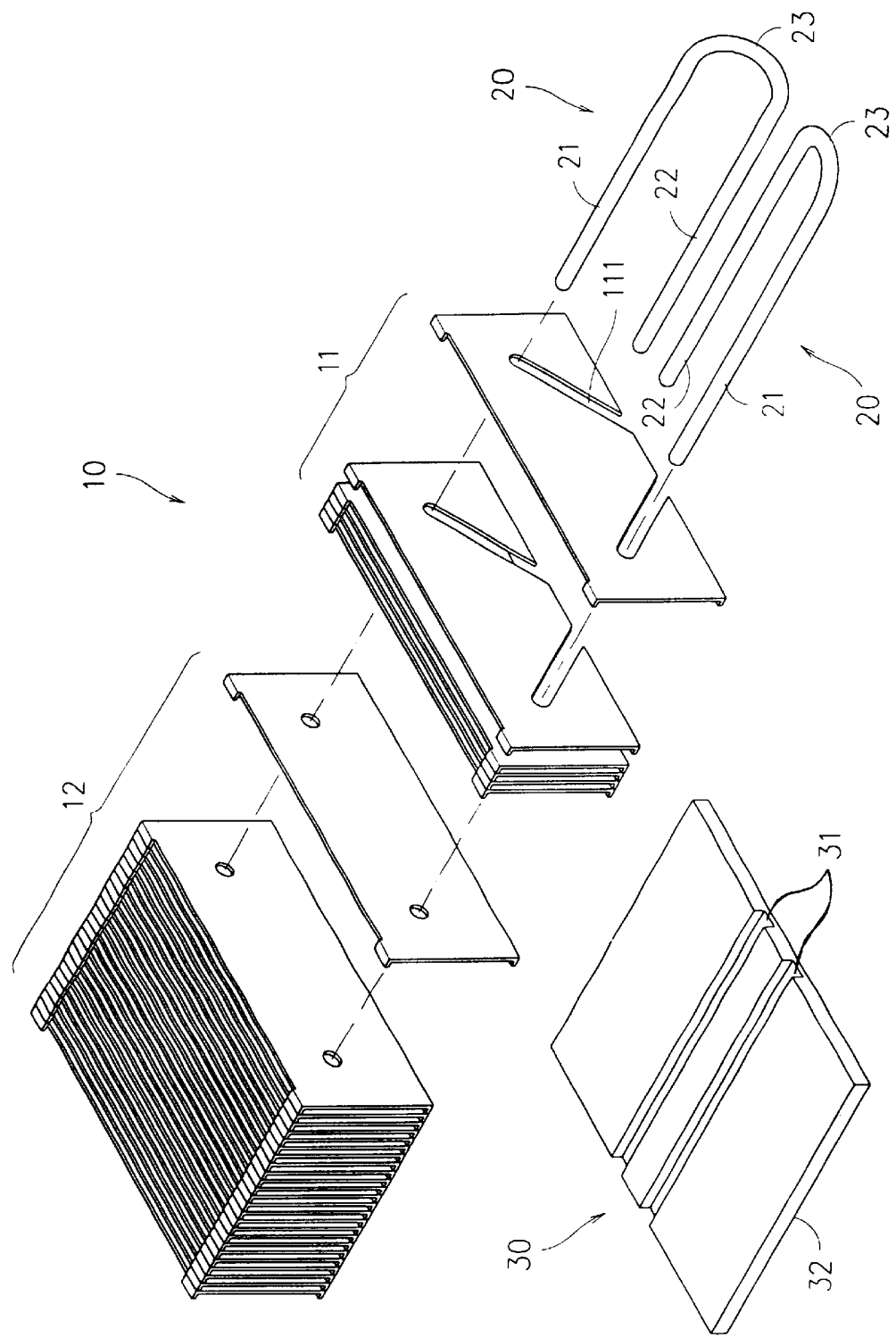
FIG. 1 is an exploded perspective view of a tube-style radiator structure of the present invention.
Figure 2:
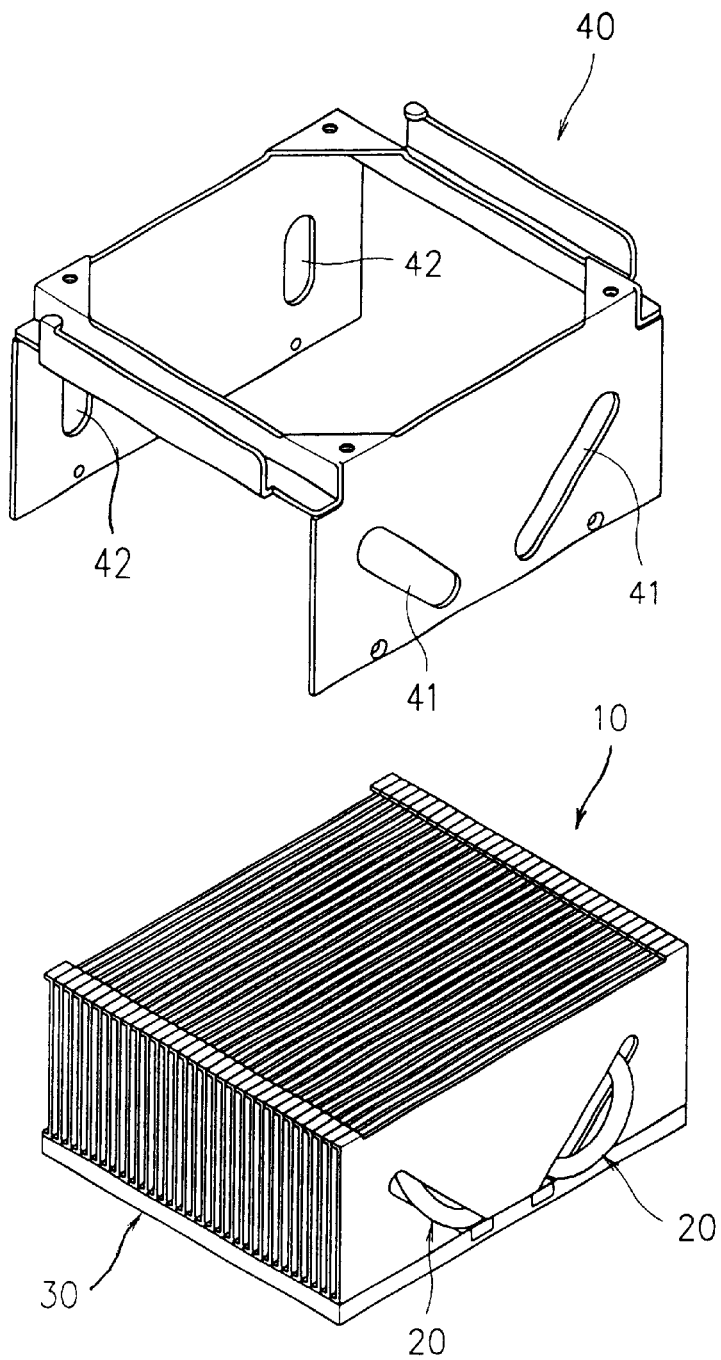
FIG. 2 is an assembled perspective view of the tube-style radiator structure shown in FIG. 1 before being attached with a cover.

Referring to FIGS. 1 and 2, a tube-style radiator structure according to the present invention includes an air-cooling fin part 10, two heat conduction tubes 20, a base 30 and a cover 40.

The air-cooling fin part 10 further includes a plurality of front fins 11 and a plurality of rear fins 12 with each of the front fins 11 having two opposite tapered slots 111 and each of the rear fins 12 having two opposite through holes corresponding to the tapered slots 111 respectively. Also, each of the tapered slots has an open lower end and an angle such as 90° or any other approximate angle is formed between the two tapered slots 111 to constitute a shape of "V".

Each of the conduction tubes 20 provides two parallel straight tube sections 21, 22 and an arc tube section 23 to form a shape of "U" so that the conductive tubes 20 is capable of being inserted into the air-cooling fin part 10 by way of the straight tube sections 21 passing through the tapered slots of the front fins 11 and the through holes of the rear fins 12 and the straight tube sections 22 being outside the air-cooling fin part 10 next to both the open ends of the tapered slots 111.

The base 30 has a flat bottom to be attached to the electronic component 50 and the air-cooling fin part 10 is disposed on the base 30. The base 30 at the upper face thereof is provided with two parallel grooves 31 corresponding to the open ends of the tapered slots 11 so that the tube sections 22 are received in the grooves 31 while the heat conduction tubes 20 are mounted to the air-cooling fin part 10.

Figure 3:
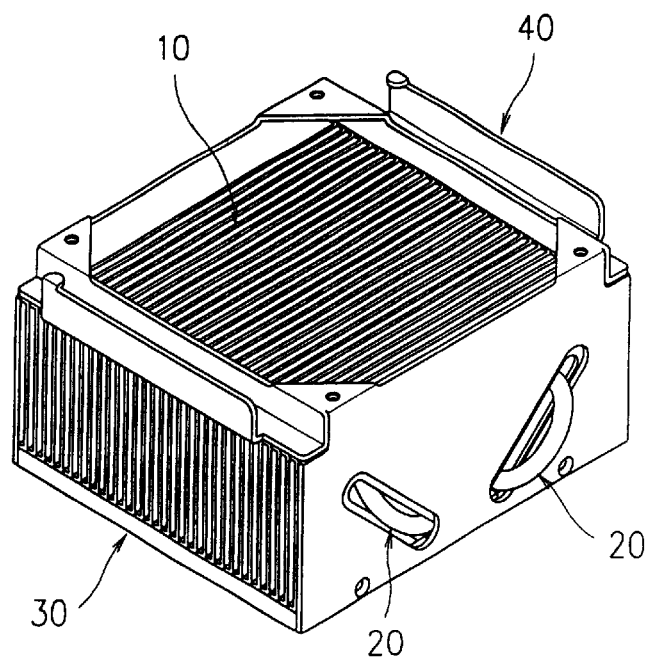
FIG. 3 is a perspective view of the tube-style radiator structure after being attached with the cover shown in FIG. 2.

Referring to FIGS. 2 and 3 again, the cover 40 has a front wall and a rear wall joined to each other with two parallel side frames. The front wall thereof is also provided two elongated slots 41 corresponding to the two tapered slots 111 but the tapered slots 41 with closed lower ends so as to accommodate the arc tube sections 23 of the heat conduction tubes 20 respectively. The rear wall of the cover 40 has two elongated holes 42 corresponding to the through holes of the rear fins 12 so as to be passed through by free ends of the straight tube sections 21 respectively. The cover 40 is used for reinforcing the air-cooling fin part 10.

Figure 4:
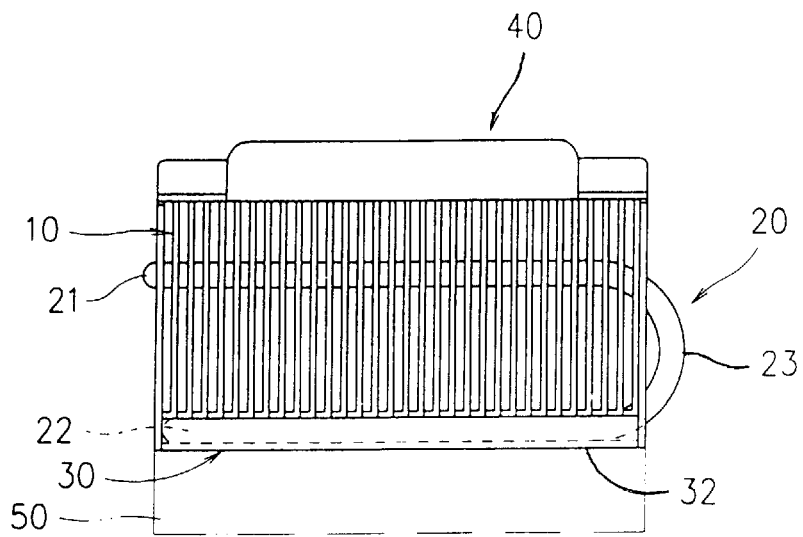
FIG. 4 is a side view of FIG. 3 illustrating the tube-style radiator structure shown in FIG. 3 being disposed on an electronic component.

As shown in FIG. 4, the base 30 is placed on the electronic component 50 with the flat bottom 32 of the base 3 pressing against the electronic component 50 such that the heat generated from the electronic component 50 can move to the base 30 via the flat bottom 32. Then, the heat, in turn, flows to the straight tube sections 22, the arc tube sections 23 and the straight tube sections 21. Because the straight tube sections 21 pass through the air-cooling fin part 10, the heat further can transmit to the front fins 11 and the rear fins 12 quickly and the air-cooling fin part 10 provides large cooling area so that a high efficiency of heat dissipation can be obtained effectively.

While the invention has been described with referencing to a preferred embodiment thereof, it is to be understood that modifications or variations may be easily made without departing from the spirit of this invention, which is defined by the appended claims.

What is claimed is:

1. A tube-style radiator structure for a computer, comprising:
    an air-cooling fin part;
    two heat conduction tubes, each of the heat conduction tubes having a shape of "U" with two straight tube sections and an arc tube section and one of the straight tube sections passing through the air-cooling fin part;
    a base, being a flat plate and disposed beneath the air-cooling fin part; and
    a cover, enclosing the air-cooling fin part;
    characterized in that the air-cooling fin part further includes a plurality of front fins and a plurality of rear fins with each of the front fins having two opposite tapered slots for accommodating the arc tube sections of the heat conduction tubes respectively and each of the rear fins having two opposite through holes corresponding to the tapered slots; the tapered slots and the through holes are passed through with the one of the straight tube sections respectively; the base at an upper face thereof have two parallel elongated grooves for receiving the other straight tube sections of the heat conduction tubes; the cover has a front wall and a rear wall joined to each other by way of two parallel side frames with the front wall thereof having two elongated slots with two closed ends corresponding to the tapered slots of the front fins and the rear wall thereof having two elongated holes for being penetrated by the one of the straight tube sections;

whereby, once the base of the tube-style radiator structure is fixedly placed on an electronic component of the computer, the heat generated from the electronic component can be transmitted to the air-cooling fin part and a high efficiency of heat dissipation can be obtained due to a large cooling area of the air-cooling fin part via the base and the heat conduction tubes.

2. The tube-style radiator structure for a computer as defined in claim 1, wherein the tapered slots on each of the front fins have lower ends thereof which are open ends.

* * * * *